US012796019B1

(12) United States Patent
Jang et al.

(10) Patent No.: US 12,796,019 B1
(45) Date of Patent: Nov. 10, 2026

(54) METAL GATE ISOLATION

(71) Applicant: Taiwan Semiconductor Manufacturing Company, Ltd., Hsinchu (TW)

(72) Inventors: Shu-Uei Jang, Hsinchu (TW); Shih-Yao Lin, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 870 days.

(21) Appl. No.: 17/807,249

(22) Filed: Jun. 16, 2022

(51) Int. Cl.

| | |
|---|---|
| ***H10D 62/10*** | (2025.01) |
| ***H10D 30/01*** | (2025.01) |
| ***H10D 30/62*** | (2025.01) |
| ***H10D 84/01*** | (2026.01) |
| ***H10D 84/03*** | (2025.01) |

(52) U.S. Cl.
CPC ......... *H10D 62/115* (2025.01); *H10D 30/024* (2025.01); *H10D 30/6211* (2025.01); *H10D 84/0151* (2025.01); *H10D 84/0158* (2025.01); *H10D 84/038* (2025.01)

(58) Field of Classification Search
CPC ..... H10D 30/6211; H10D 30/62–6219; H10D 30/024–0245; H10D 84/0151; H10D 84/0158; H10D 84/038; H10D 84/0193; H10D 86/011; H10D 84/834; H10D 84/853; H10D 62/115; H10D 86/215; H10B 12/36; H10B 12/056
See application file for complete search history.

(56) References Cited

U.S. PATENT DOCUMENTS

| | | | | |
|---|---|---|---|---|
| 10,373,877 | B1 * | 8/2019 | Wang | H10D 84/017 |
| 2017/0352595 | A1 * | 12/2017 | Li | H10D 84/038 |
| 2019/0157387 | A1 * | 5/2019 | Wu | H01L 21/0228 |
| 2019/0181090 | A1 * | 6/2019 | Reznicek | H01L 23/62 |
| 2019/0378903 | A1 * | 12/2019 | Jeon | H10D 64/516 |
| 2020/0020794 | A1 * | 1/2020 | Lin | H10D 62/115 |
| 2020/0083222 | A1 * | 3/2020 | Kim | H10D 84/038 |
| 2020/0105613 | A1 * | 4/2020 | Hung | H10D 30/608 |
| 2020/0135574 | A1 * | 4/2020 | Yang | H10D 84/0158 |
| 2020/0211903 | A1 * | 7/2020 | Shu | H10D 84/834 |
| 2021/0090948 | A1 * | 3/2021 | Chen | H01L 21/2254 |
| 2021/0125875 | A1 * | 4/2021 | Tsai | H10D 84/038 |

* cited by examiner

*Primary Examiner* — Steven B Gauthier
*Assistant Examiner* — Rhys Poniente Sheker
(74) *Attorney, Agent, or Firm* — Ingrassia Fisher & Lorenz, LLP | IF&L

(57) ABSTRACT

Disclosed is a method of fabricating a semiconductor device that includes: providing a substrate, fin structures protruding above the substrate, STI material disposed between the fin structures, a gate structure that includes a PO layer disposed above the fin structures and the STI material, and an ILD structure disposed above and around the PO layer. The method further includes providing a patterned structure above the ILD structure; forming a first opening in the ILD structure in a region exposed by the patterned structure; forming a second opening in the gate structure to separate the gate structure into multiple sections, wherein the second opening has a bottom that rests on the top of the hybrid fin structure and the second opening has a BCD that is smaller than a MCD of the second opening; and filling the first and second openings in the gate structure with a dielectric material.

20 Claims, 15 Drawing Sheets

METAL GATE ISOLATION

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (FinFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
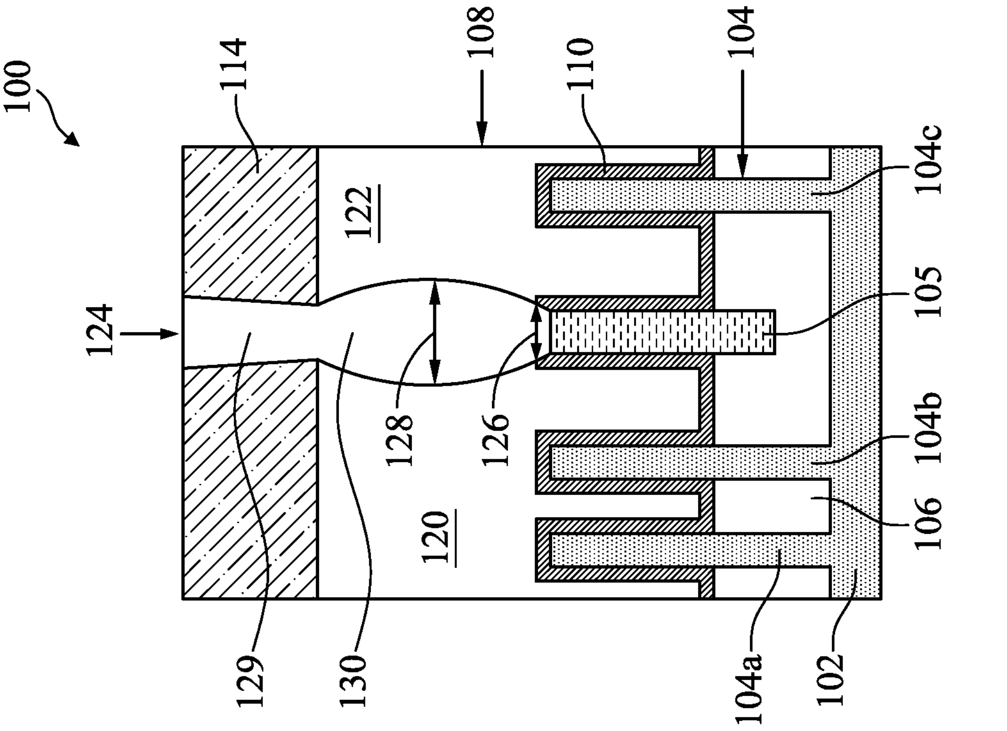
FIG. 1B is a diagram that provides a cross-sectional view of the portion of the semiconductor device of FIG. 1A at a later stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

For the sake of brevity, conventional techniques related to conventional semiconductor device fabrication may not be described in detail herein. Moreover, the various tasks and processes described herein may be incorporated into a more comprehensive procedure or process having additional functionality not described in detail herein. In particular, various processes in the fabrication of semiconductor devices are well-known and so, in the interest of brevity, many conventional processes will only be mentioned briefly herein or will be omitted entirely without providing the well-known process details. As will be readily apparent to those skilled in the art upon a complete reading of the disclosure, the structures disclosed herein may be employed with a variety of technologies, and may be incorporated into a variety of semiconductor devices and products. Further, it is noted that semiconductor device structures include a varying number of components and that single components shown in the illustrations may be representative of multiple components.

Furthermore, spatially relative terms, such as “over”, “overlying”, “above”, “upper”, “top”, “under”, “underlying”, “below”, “lower”, “bottom”, and the like, may be used herein for ease of description to describe one element’s or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When a spatially relative term, such as those listed above, is used to describe a first element with respect to a second element, the first element may be directly on the other element, or intervening elements or layers may be present. When an element or layer is referred to as being "on" another element or layer, it is directly on and in contact with the other element or layer.

It is noted that references in the specification to "one embodiment," "an embodiment," "an example embodiment," "exemplary," "example," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to affect such feature, structure, or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

Gate structures in field effect transistors may extend across two or more transistors. For example, the gate structures may be formed as long "lines" across the active regions of the substrate, such as the fin structures. Once the gate structures are formed, a patterning process "cuts" the long gate structure to shorter sections according to a desired layout. In other words, the patterning process removes portions of the long gate structure and portions of interlayer dielectric (ILD) structure surrounding the long gate structure to form one or more "cuts" and separate the long line into shorter sections. This process may be referred to as a cut-metal-gate (CMG) process. Subsequently, the cuts formed between the separated sections of the long gate structure are filled with a gap fill material, such as a dielectric material of silicon nitride (SN). Silicon nitride not only electrically isolates adjacent sections of the long gate structure, but also protects the exposed gate structure layers from oxygen diffusion.

A similar process, referred to as cut-dummy-poly (CPO), involves removing portions of a long hybrid or dummy gate structure and portions of interlayer dielectric (ILD) structure surrounding the long hybrid or dummy gate structure to form one or more "cuts" and separate the long line of the hybrid gate structure into shorter sections. Subsequently, the cuts formed between the separated sections of the hybrid gate structure are filled with a gap fill structure, such as a dielectric material of SN. The CPO process may be performed before metal gate (MG) fill, whereas the CMG process may be performed after MG fill. Each process has its own advantages and disadvantages.

In novel technology devices, such as FinFET, Nanosheet-FET, GAAFET, and others, isolating a metal gate (MG) through a cut process can become difficult due to a small MG critical dimension (CD) (e.g., shrinking pitch). Embodiments will now be described with respect to particular examples including FinFET manufacturing processes. Embodiments, however, are not limited to the examples provided herein, and the ideas may be implemented in a wide array of embodiments. The subject matter disclosed herein may be applied to the CPO and the CMG processes. The subject matter disclosed herein uses an etching end-step to control the bottom profile of the "cut" to reduce the leakage risk between isolated gates.

While the figures illustrate various embodiments of a semiconductor device, additional features may be added in the semiconductor device depicted in the Figures and some of the features described below can be replaced, modified, or eliminated in other embodiments of the semiconductor device.

Figure 1A:
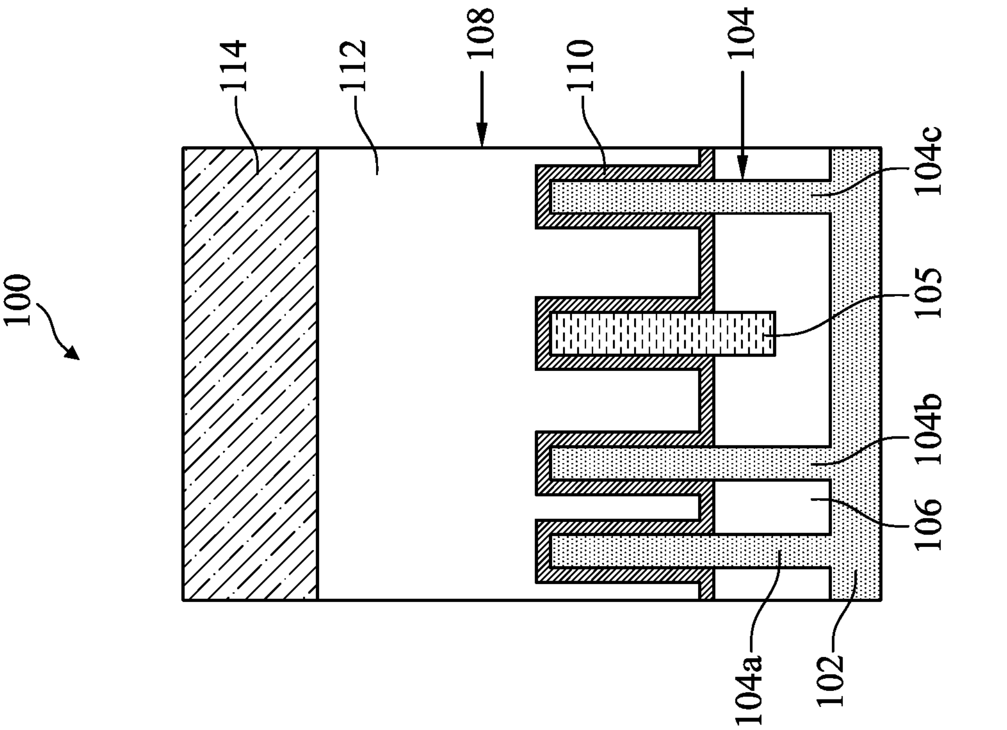
FIG. 1A is a diagram that provides a cross-sectional view of a portion of a semiconductor device at one stage of fabrication, in accordance with some embodiments.

Referring now to the Figures, FIG. 1A provides a cross-sectional view of a portion of a semiconductor device 100 at one stage of fabrication. The example semiconductor device 100 is a FinFET device and includes a substrate 102, fin structures 104*a*, 104*b*, 104*c* (collectively referred to as 104) protruding from the substrate 102 in a Z-direction (e.g., vertical direction) above the substrate 102, a shallow trench isolation (STI) region 106 disposed between the fin structures (104*a*, 104*b*, 104*c*), and a hybrid fin 105 protruding in a Z-direction from the STI region 106 above the substrate 102. As shown, the fin structures 104 and the hybrid fin 105 are spaced apart from one another in a Y-direction and extend parallel to one another in an X-direction.

In some embodiments, the substrate 102 is a bulk semiconductor wafer or a top layer of a semiconductor on insulator wafer such as, for example, silicon on insulator. Further, substrate 102 can be made of silicon (Si) or another elementary semiconductor such as (i) germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic). In some embodiments, substrate 102 has a crystalline microstructure—e.g., it is not amorphous or polycrystalline.

The fin structures 104 shown in FIG. 1A may be formed on the substrate 102 via patterning. For example, the fin structures 104 may be patterned using one or more photolithography processes, including double-patterning or multi-patterning processes. Double-patterning or multi-patterning processes can combine photolithography and self-aligned processes, allowing patterns to be created that have, for example, a smaller pitch than what is otherwise obtainable using a single, direct photolithography process. For example, in some embodiments, a sacrificial layer is formed over a substrate (e.g., substrate 102) and patterned using a photolithography process. Spacers are formed alongside the patterned sacrificial layer using a self-aligned process. The sacrificial layer is then removed, and the remaining spacers may then be used to pattern the fin structures 104. The fin structures 104 can be parallel to each other. In some embodiments, additional fin structures, like the fin structures 104, can be formed parallel to the fin structures 104 on the substrate 102. These additional fin structures are not shown in show in FIG. 1A for simplicity.

In some embodiments, the fin structures 104 are made of the same material as the substrate 102, or different. By way of example and not limitation, the fin structures 104 can be made of Si or another elementary semiconductor such as, for example, (i) Ge; (ii) a compound semiconductor including SiC, GaAs, GaP, InP, InAs, and/or InSb; (iii) an alloy semiconductor including SiGe, GaAsP, AlInAs, AlGaAs, GaInAs, GaInP, and/or GaInAsP; or (iv) combinations thereof. In some embodiments, the fin structures 104 have a crystalline microstructure—e.g., they are not amorphous or polycrystalline.

In some embodiments, the hybrid fin 105 is formed from one or more dielectric materials. Suitable dielectric materials for the hybrid fin 105 may include silicon oxides, silicon nitrides, silicon carbides, fluorosilicate glass (FSG), low-K dielectric materials, and/or other suitable dielectric materials. The dielectric material may be deposited by any suitable technique including thermal growth, flowable CVD (FCVD), HDP-CVD, PVD, ALD, and/or spin-on techniques.

According to some embodiments, the STI region 106 is deposited with a flowable chemical vapor deposition process (e.g., flowable CVD) to ensure that the STI region 106 fills the space between the fin structures 104 without forming seams or voids. In some embodiments, the STI region 106 can have a dielectric material, such as silicon oxide, silicon nitride, silicon oxynitride, fluorine-doped silicate glass (FSG), a low-k dielectric material, and/or other suitable insulating materials. In some embodiments, the STI region 106 is a silicon oxide based dielectric that includes, for example, nitrogen and/or hydrogen. To improve further its dielectric and structural properties, the STI region 106 may be subjected to a wet steam anneal (e.g., 100% water molecules) at a temperature between about 800° C. and about 1200° C. During the wet steam anneal, the STI region 106 densifies, and its oxygen content may increase. The STI region 106 can provide electrical isolation to the fin structures from neighboring active and passive elements (not shown) integrated with or deposited onto the substrate 102.

Disposed above the fin structures 104, hybrid fin 105, and the STI region 106 is a gate structure 108. The gate structure 108 can include several layers including a gate dielectric layer 110 disposed above and along sides of the fin structures 104 and hybrid fin 105, and above the STI region 106, a work function layer (not shown), and a polysilicon (PO) layer 112 disposed above the gate dielectric layer 110 that forms a gate electrode, and other intervening layers not shown in FIG. 1A and the subsequent figures. Disposed above and around the PO layer 112 is an interlayer dielectric (ILD) structure 114 composed of silicon nitride (SN) in this example, which can be used as a hard mask layer.

The dimensions of the fin structures 104, hybrid fin 105, and gate structures 108 can be similar to or different from the ones shown in FIG. 1A. Additionally, FIG. 1A and the subsequent figures are for illustrative purposes only and are not to scale. FIG. 1A and the subsequent figures may not reflect the actual geometry of the actual structures, features, or films. Some structures, films, or geometries may have been deliberately augmented for illustrative purposes.

FIG. 1B provides a cross-sectional view of the portion of the semiconductor device 100 at a later stage of fabrication. A patterning process has been applied to remove portions of the gate structure 108 (forming a second opening 130) and portions of the ILD structure 114 surrounding the gate structure 108 (forming a first opening 129) to form a cut 124 (e.g., first opening 129 and second opening 130) that separates the gate structure 108 into two shorter gate sections 120, 122. An etching end-step has been implemented during the patterning process to control the bottom profile of the cut 124 and reduce the leakage risk between the gate sections 120, 122.

The patterning process has resulted in a bottom critical dimension (BCD) 126 at the bottom of the cut 124 (which is on the top of the hybrid fin 105) to have a smaller dimension than the middle critical dimension (MCD) 128 of the cut 124 (MCD>BCD). In some embodiments, the MCD 128 is 1.2 times the BCD 126 (MCD=1.2*BCD). Because the BCD 126 is smaller than the MCD 128, more gate material exists in each gate section 120, 122 than if the BCD 126 was approximately equal to the MCD 128 (e.g., MCD=0.9~1.1*BCD) leading to reduce leakage risk. Additionally, the patterning process results in the cut 124 extending into the hybrid fin 105 ensuring that the gate dielectric layer 110 disposed above the hybrid fin 105 is removed thereby further reducing leakage risk between gate sections 120, 122. In some embodiments, the cut 124 extends into the hybrid fin 105 by at least 3 nanometers (nm) (i.e., etching of hybrid fin 105 >3 nm).

Figure 2A:
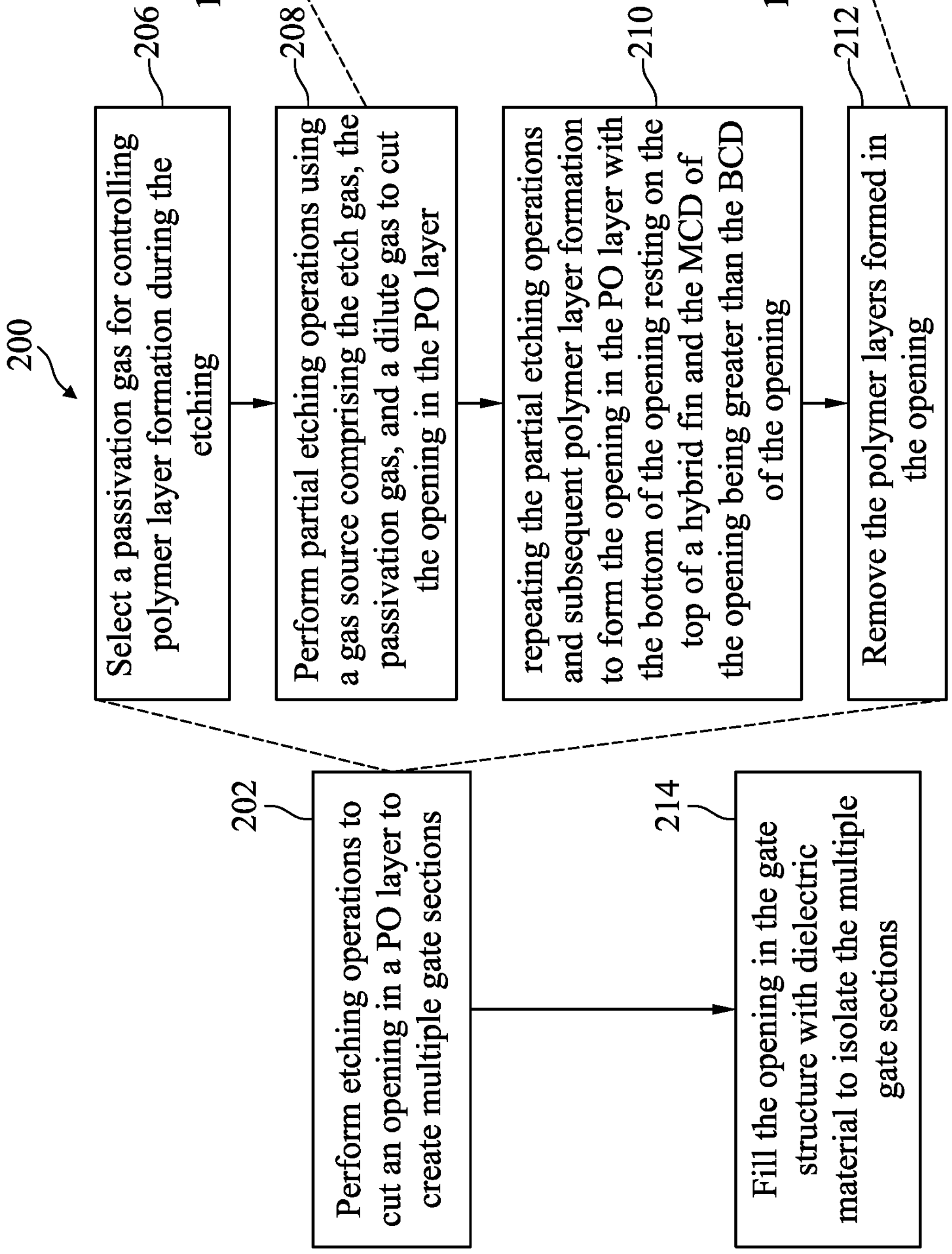
FIG. 2A is a process flow chart depicting an example fabrication process that includes etching condition tuning to achieve a cut with a BCD having a smaller dimension than a MCD and/or the cut extending into a fin structure, in accordance with some embodiments.
Figure 2B:
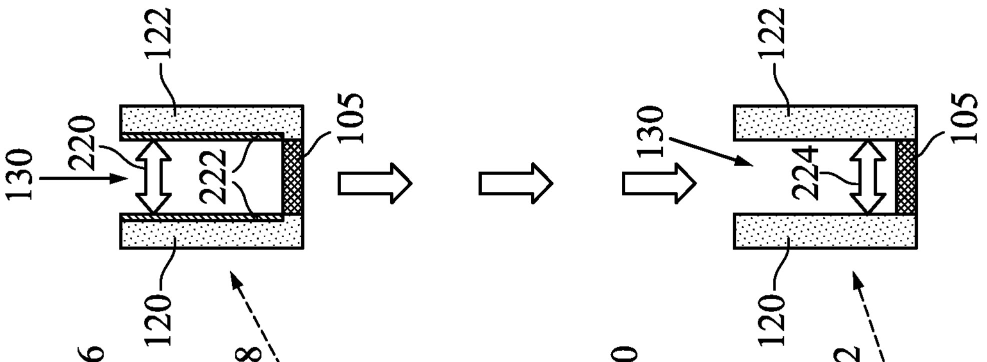
FIG. 2B is a diagram illustrating example stages of an example cut during performance of the various operations of the flow chart of FIG. 2A, in accordance with some embodiments.

FIG. 2A is a flow chart of a fabrication process 200 that includes etching condition tuning to achieve a cut with a BCD having a smaller dimension than a MCD (e.g., the MCD=1.2*BCD) and/or the cut extending into the fin structure (e.g., by at least 3 nm). Additional fabrication operations may be performed between the various operations of process 200 and may be omitted merely for clarity and ease of description. These various operations are within the spirit and the scope of this disclosure. Moreover, not all operations may be required to perform the disclosure provided herein. Additionally, some of the operations may be performed simultaneously, or in a different order than the ones shown in FIG. 2A. Accordingly, it is understood that additional processes can be provided before, during, and/or after process 200, and that some other processes may only be briefly described herein. For illustrative purposes, process 200 will be described with reference to the embodiments shown in FIGS. 1B and 2B, wherein FIG. 2B illustrates example stages of the example cut 124 during performance of the various operations of FIG. 2A. The figures provided to describe process 200 are for illustrative purposes only and are not to scale. In addition, the figures may not reflect the actual geometry of the actual structures, features, or films. Some structures, films, or geometries may have been deliberately augmented for illustrative purposes.

The example process 200 includes performing etching operations (e.g., in a plasma dry etch chamber) to cut an opening 130 in the PO layer 112 between gate section 120, gate section 122, and the top of hybrid fin 105 (operation 202). The opening is cut below an opening 129 in the ILD structure 114 that is disposed above the hybrid fin 105.

The etching operations include selecting a passivation gas for controlling polymer layer formation during the etching (operation 206) and performing partial etching operations using a gas source comprising an etch gas, the passivation gas, and a dilute gas to cut the opening 130 between gate section 120, gate section 122, and the top of hybrid fin 105 (operation 208). The ILD structure 114 is employed as an etch mask in the plasma dry etch chamber and the opening in the ILD structure 114 defines the location of the opening 130. Surfaces of gate sections 120,122 are etched in the plasma dry etch chamber to produce the opening 130. The opening 130 at this stage has a first CD 220. During the partial etching operations, polymer layers 222 may form on sidewalls of the gate sections 120, 122. In various embodiment, the partial etching operations produce the opening 130 with a first CD 220 equal to about 13.5 nm.

In various embodiments, the partial etching is accomplished using a gas source comprising etch gas (e.g., $Cl_2$/HBr/$CF_4$/$CHF_3$/$CH_2F_2$/$CH_3F$/$C_4F_6$/$BCl_3$/$SF_6$/$H_2$/$NF_3$), passivation gas (e.g., $N_2$/$O_2$/$CO_2$/$SO_2$/CO/$CH_4$/$SiCl_4$) and dilute gas (e.g., Ar/He/Ne). In various embodiments, during the partial etching, the etch gas is administered between about 0 sccm (standard cubic centimeters per minute) to about ~5000 sccm to etch the gate section 120, gate section 122, and the top of hybrid fin 105 with a chamber pressure of from about 1 mTorr to about 5 mTorr, at a source power from about 10 W to about 3000 W, and at a bias power from about 0 W to about 3000 W. In various embodiments, during the partial etching, the passivation gas is applied in the etch chamber to control the rate of polymer formation thereby achieving better step coverage of the etched feature. The amount of polymer deposited on the sidewalls of gate sections 120, 122 may be controlled by adjusting the flow rate of the passivation gas, the etching time and the deposition time as is known to those skilled in the art. The dilute gases may also be optionally added to the etchant gases for diluent and ion density control. The respective gas flow rates and etching parameters are optimized by etchant and parameter selection to obtain high etch rate selectivity. These optimization procedures are well-known to those skilled in the art.

The etching operations further include repeating the partial etching operations and subsequent polymer layer formation to form the opening 130 with the bottom of the opening 130 resting on the top of the hybrid fin 105 and the MCD of the opening 130 being greater than the BCD of the opening 130 (operation 210).

After formation of the opening 130, the example process 200 includes removing the polymer layers 222 formed in the opening 130 (operation 212). The polymer layers 222 may be removed by conventional methods, such as, for example, wet strip or plasma ashing operations. These procedures are well-known by those skilled in the art and widely practiced. These operations can accomplish sidewall oxide etching without etching the top of the hybrid fin 105. In various embodiment, the polymer layer removal produces the opening 130 with a second CD 224 equal to about 14 nm.

As a result of performing the example process 200, the second opening 130 can be formed with a bottom profile that reduces a leakage risk between the gate sections 120, 122. The example process 200 may further include filling the opening 130 with dielectric material to isolate the gate sections 120, 122 from each other (operation 214).

Figure 8:
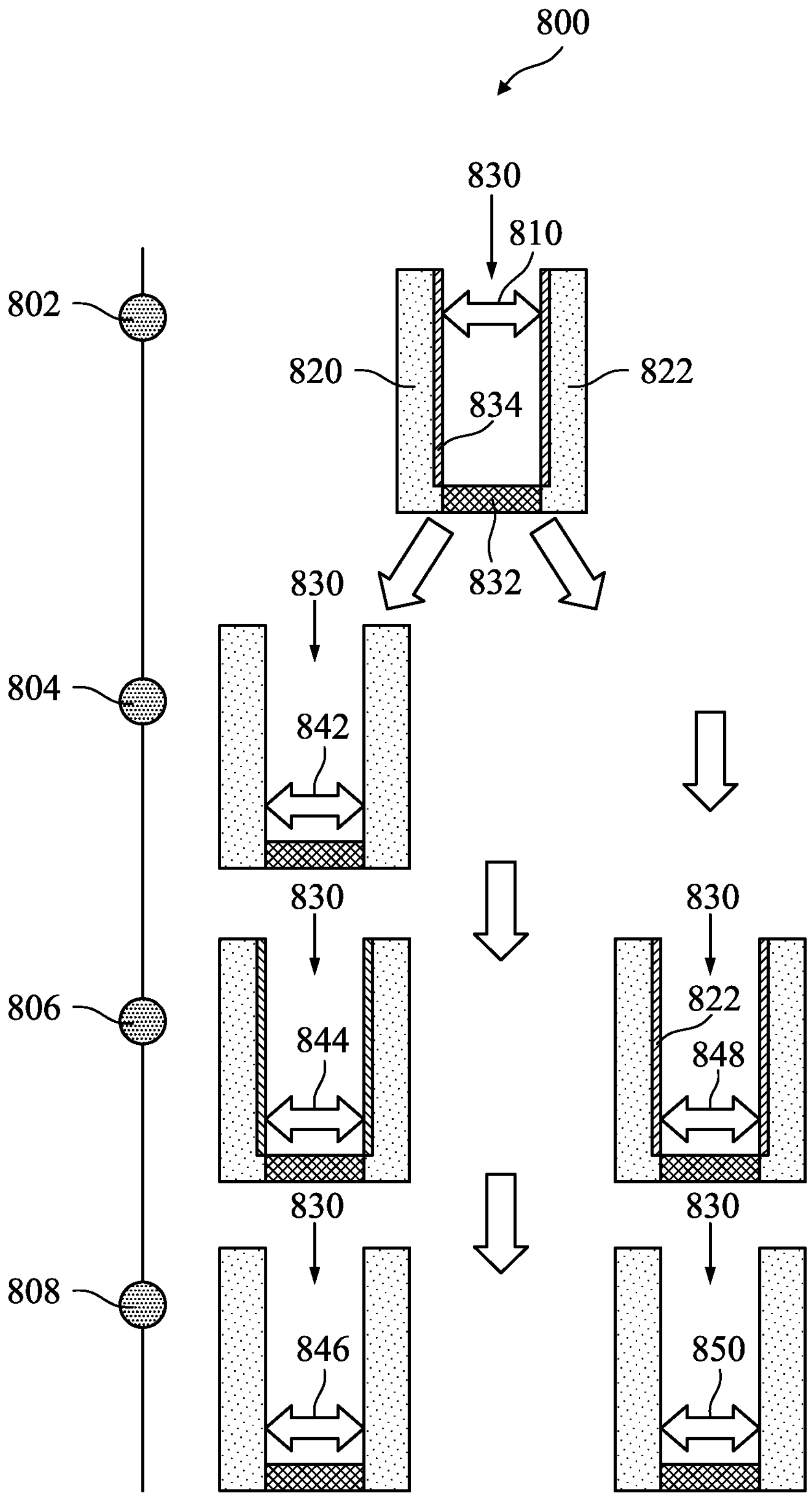
FIG. 8 is a process flow chart depicting an example cleaning process 800 for removing unwanted polymer residue formed in an opening, in accordance with some embodiments.

FIG. 8 is a process flow chart depicting an example cleaning process 800 for removing unwanted polymer residue formed in an opening 830 between gate sections 820, 822 as a result of a CPO process or a CMG process, in accordance with various embodiments.

At operation 802, the example cleaning process 800 includes providing an opening 830 between gate sections 820, 822 with a bottom of the opening 830 resting on the top of a hybrid fin 832, a CD 840 (e.g., 13.5 nm), and polymer residue 834 formed in the opening 830 on sidewalls of the gate sections 820, 822. Potential processes that may be included in the cleaning process 800 for removing the polymer residue 834 from sidewalls of gate sections 820, 822 include a pre-cleaning process (804), a plasma cleaning process (806), and a wet clean process (808).

The pre-cleaning process (804) may be performed using a fluorine-containing gas. The fluorine-containing gas may include tetrafluoromethane ($CF_4$), sulfur hexafluoride ($SF_6$), or nitrogen trifluoride ($NF_3$), other applicable gas or combinations thereof. The plasma cleaning process (806) may be performed using an oxygen plasma, or the like, in an inert atmosphere such a nitrogen, argon, or the like. The wet clean process (808) may be performed by flowing chemical solutions into the opening.

In one example implementation, performing the cleaning process 800 with the pre-cleaning process (804) may result in the opening 830 having less polymer residue and a CD 842 of 14 nm after the pre-cleaning process (804), the opening 830 having a thicker oxidation level 824 and a CD 844 of 14 nm after the plasma cleaning process (806), and the opening 130 having the polymer residue and oxidation layer removed but with a CD 846 of 15.5 nm after the wet clean process (808).

When the opening 130 is formed using etching condition tuning, the pre-cleaning process (804) is not necessary and may be omitted from the cleaning process 800. Thus, to remove the unwanted polymer residue 834, the cleaning process 800 may include the plasma cleaning process (806), followed by a wet clean process (808), without a pre-cleaning process (804).

In one example implementation, performing the cleaning process 800 without the pre-cleaning process (804) may result in the opening 130 having some polymer residue and a CD 848 of about 14 nm after the plasma cleaning process (806), and the opening having the polymer residue removed with a CD 850 of about 14 nm after the wet clean process (808). Performing the cleaning process 800 without the pre-cleaning process (804) may result in an opening 130 with a smaller CD 850 after the cleaning process 800 has been completed than a CD 846 that may be obtained with a cleaning process that included the pre-cleaning process (804), (e.g., CD 850<CD 846).

Figure 3A:
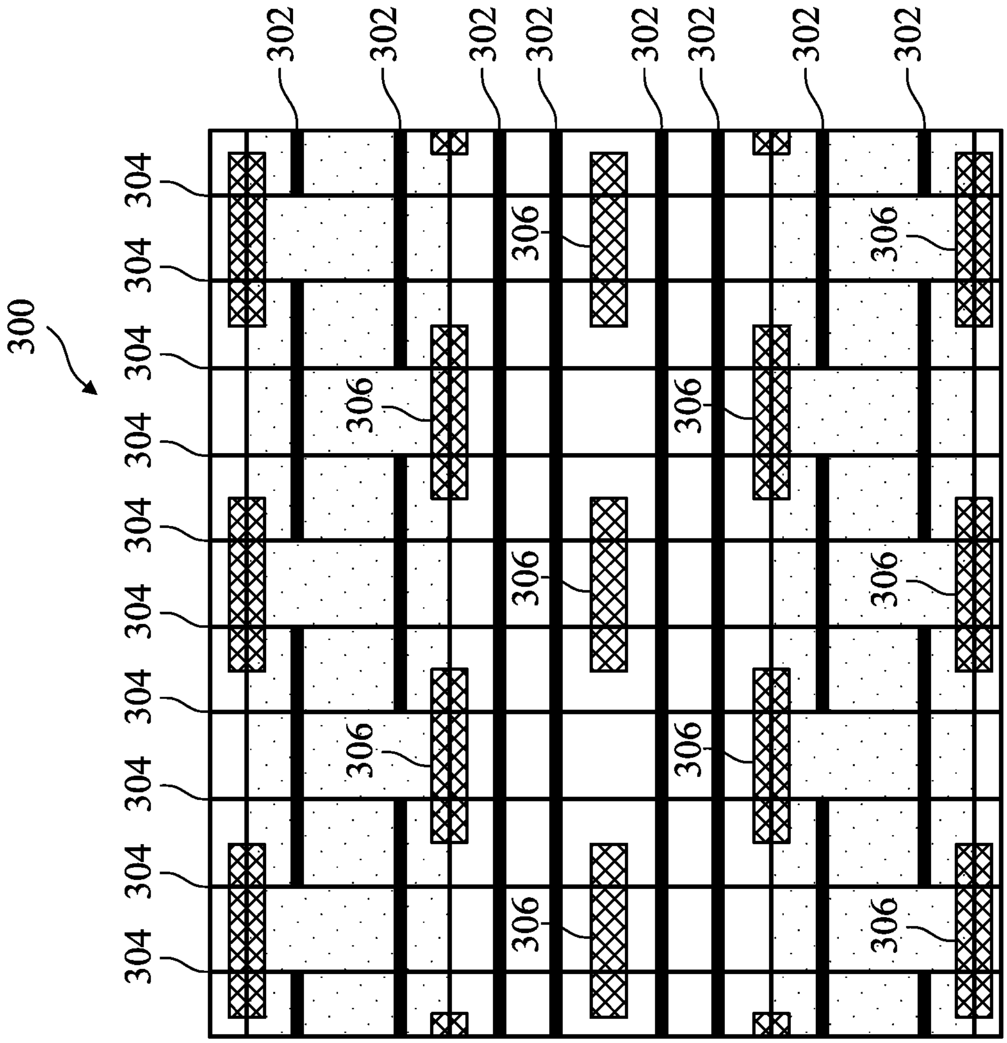
FIG. 3A is a diagram depicting a partial top view of an example semiconductor device during a stage of fabrication that illustrates dense cuts that are made to gate structures, in accordance with some embodiments.

Both a CPO process and a CMG process may be performed with etching condition tuning. FIG. 3A is a partial top view of a semiconductor device 300 during a stage of fabrication that illustrates dense cuts that are made to gate structures and FIG. 3B is a partial top view of a semiconductor device 320 during a stage of fabrication that illustrates isolation cuts that are made to gate structures.

FIG. 3A illustrates a semiconductor device 300 that includes a plurality of fins 302 extending in an X-direction and a plurality of polysilicon gate structures 304 extending in a Y-direction across a plurality of the fins 302. In this example, the fin to fin pitch is from about 10 to 50 nm and the cut process (CPO or CMG) is considered to provide a dense cut 306. Shown are a plurality of dense cuts 306 wherein each dense cut 306 (e.g., cut 2 gate) separates two polysilicon gate structures 304. In various embodiments, the dense cuts have a MCD of about 8 to 25 nm and a BCD of about 10 to 20 nm. In various embodiments, the width of the fins 302 are about 2 to 50 nm (Fin CD) and the length of the fins 302 are about 2 to 500 nm (Gate CD).

Figure 3B:
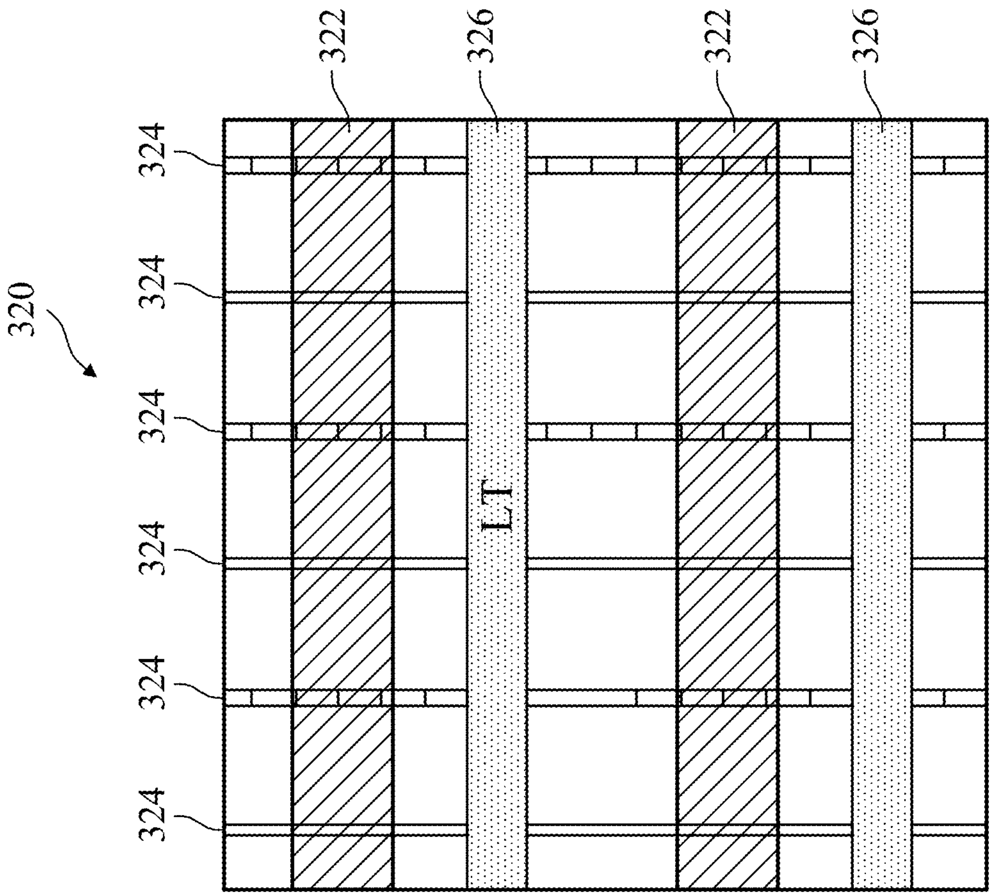
FIG. 3B is a diagram depicting a partial top view of an example semiconductor device during a stage of fabrication that illustrates isolation cuts that are made to gate structures, in accordance with some embodiments.

FIG. 3B illustrates a semiconductor device 320 that includes a plurality of fins 322 extending in an X-direction and a plurality of polysilicon gate structures 324 extending in a Y-direction across a plurality of the fins 322. In this example, the fin to fin pitch is from about 50 to 100 nm and the cut process (CPO or CMG) is considered to provide an isolated cut 326. Shown are a plurality of isolation cuts 306 wherein each isolation cut 326 (e.g., cut LT) comprises a long trench that separates many polysilicon gate structures 324. In various embodiments, the isolation cuts have a MCD of about 20 to 50 nm and a BCD of about 15 to 35 nm. In various embodiments, the width of the fins 322 are about 2 to 50 nm (Fin CD) and the length of the fins 322 are about 2 to 500 nm (Gate CD).

Figure 4:
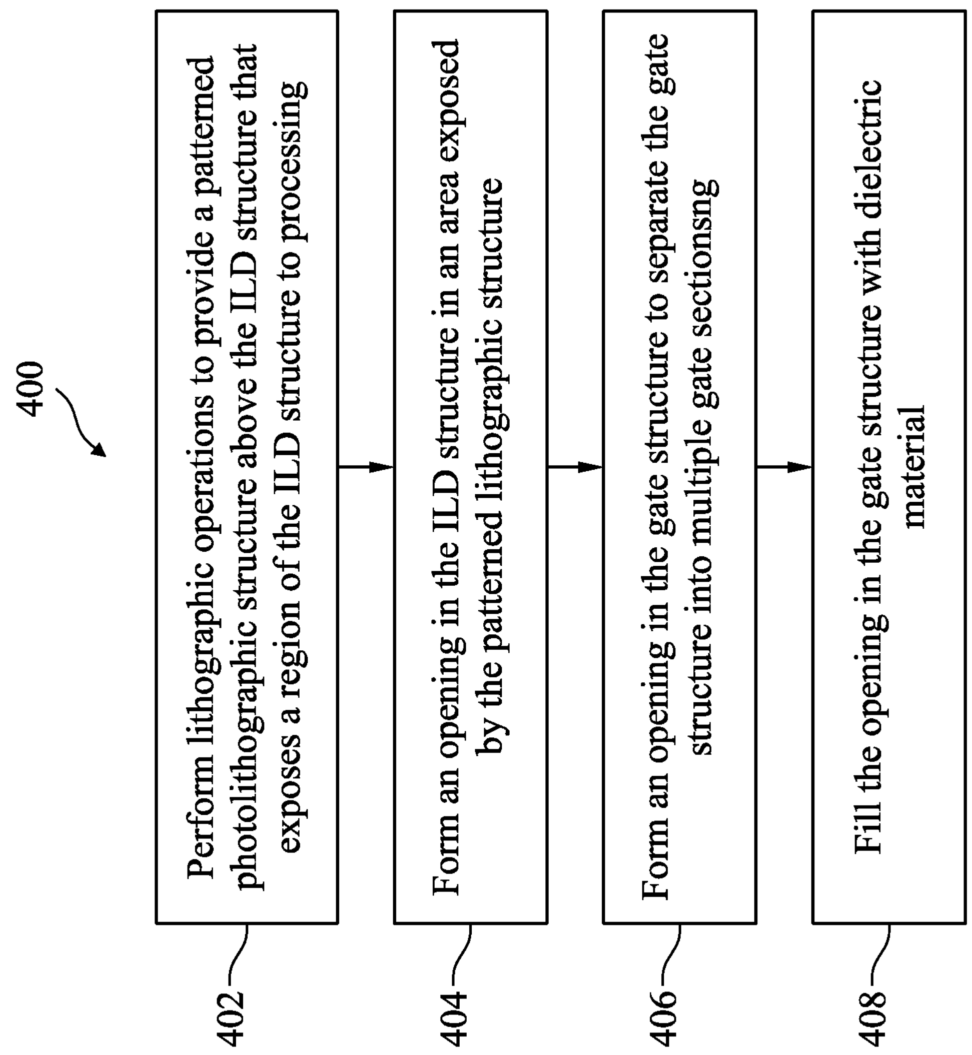
FIG. 4 is a process flow chart depicting an example fabrication process that utilizes etching condition tuning to achieve a cut with a BCD having a smaller dimension than a MCD and/or the cut extending into a fin structure, in accordance with some embodiments.

FIG. 4 is a process flow chart depicting an example fabrication process 400 that utilizes etching condition tuning to achieve a cut with a BCD having a smaller dimension than a MCD (e.g., the MCD=1.2*BCD) and/or the cut extending into the fin structure (e.g., by at least 3 nm). Additional fabrication operations may be performed between the various operations of process 400 and may be omitted merely for clarity and ease of description. These various operations are within the spirit and the scope of this disclosure. Moreover, not all operations may be required to perform the disclosure provided herein. Additionally, some of the operations may be performed simultaneously, or in a different order than the ones shown in FIG. 4. Accordingly, it is understood that additional processes can be provided before, during, and/or after process 400, and that some other processes may only be briefly described herein.

For illustrative purposes, process 400 will be described with reference to the embodiments of a 3-D (three dimensional) semiconductor device 500 shown in FIGS. 5A-5F and 6A-6F, wherein FIGS. 5A, 5D, 6A, and 6D are partial isometric views of a gate structure of the 3-D semiconductor device 500 at various stages of fabrication, FIGS. 5B, 5E, 6B, and 6E are cross sectional views along an X-X cut line of the gate structure of the 3-D semiconductor device 500 at various stages of fabrication, and FIGS. 5C, 5F, 6C, and 6F are cross sectional views along a Y-Y cut line of the gate structure of the 3-D semiconductor device 500 at various stages of fabrication during performance of the various operations of FIG. 4. The figures provided to describe process 400 are for illustrative purposes only and are not to scale. In addition, the figures may not reflect the actual geometry of the actual structures, features, or films. Some structures, films, or geometries may have been deliberately augmented for illustrative purposes.

It is understood that parts of the semiconductor device 500 may be fabricated by typical semiconductor technology process flow, and thus some processes are only briefly described herein. Further, the exemplary semiconductor device may include various other devices and features, such as other types of devices such as additional transistors, bipolar junction transistors, resistors, capacitors, inductors, diodes, fuses, and/or other logic devices, etc., but is simplified for a better understanding of concepts of the present disclosure. In some embodiments, the exemplary devices include a plurality of semiconductor devices (e.g., transistors), including PFETs, NFETs, etc., which may be interconnected. Moreover, it is noted that the operations of process 400, including any descriptions given with reference to the Figures are merely exemplary and are not intended to be limiting beyond what is specifically recited in the claims that follow.

Figure 5A:
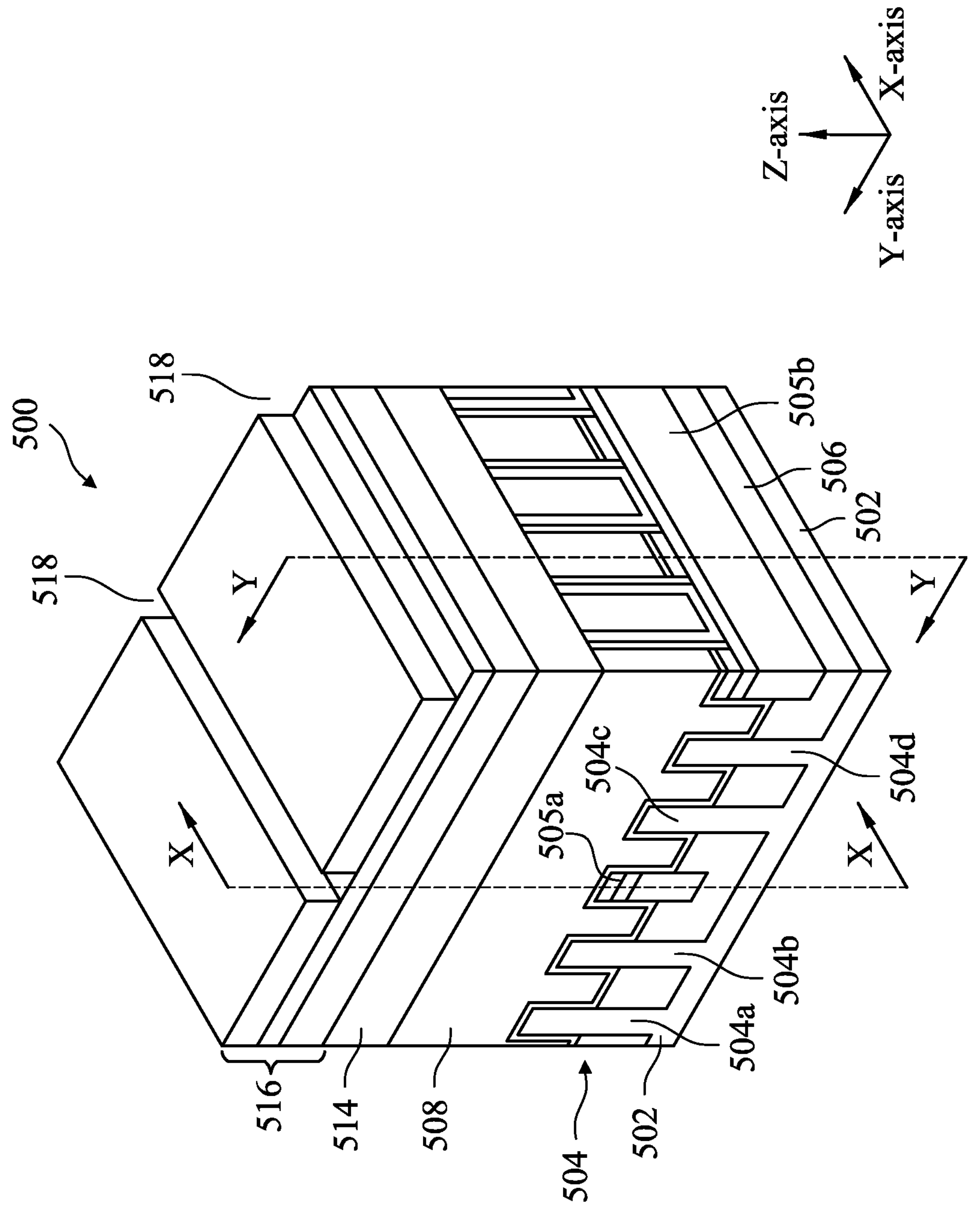
FIGS. 5A, 5D, 6A, and 6D are partial isometric views of a gate structure of a 3-D semiconductor device at various stages of fabrication, in accordance with some embodiments.

The example 3-D semiconductor device 500 depicted in FIG. 5A is a FinFET device and includes a substrate 502, fin structures 504*a*, 504*b*, 504*c*, and 504*d* (collectively referred to herein as 504) protruding in a Z-direction (e.g., vertical direction) above the substrate 502, and hybrid fin structures 505*a* and 505*b* (collectively referred to herein as 505) also protruding in a Z-direction above the substrate 502. As shown, the fin structures 504 are spaced apart from one another in a Y-direction and extend parallel to one another in an X-direction. As further shown, fin structures 504 are isolated by a shallow trench isolation (STI) material 506. Fin structures 504*a*, 504*b*, 504*c*, and 504*d* are illustrated as protruding from the substrate 502, and hybrid fin structures 505*a* and 505*b* are separated from the substrate 502.

Disposed above the fin structures 504, hybrid fin structures 505, and the STI material 506 is a gate structure 508. The gate structure 508 can include several layers including a gate dielectric layer (not shown) disposed above and along sides of the fin structures 504 and hybrid fin structures 505, and above the STI material 506, a work function layer (not shown), and a polysilicon (PO) layer disposed above the gate dielectric layer that forms a gate electrode, and other intervening layers not shown in FIG. 5A and the subsequent figures. Disposed above and around the gate structure 508 is an interlayer dielectric (ILD) structure 514 composed of silicon nitride (SN) in this example. Disposed above the ILD structure 514 is a patterned photolithographic structure 516 (e.g., a hard mask), such as one including a bottom anti-reflective coating (BARC) and/or photoresist (PR) material.

Figure 5C:
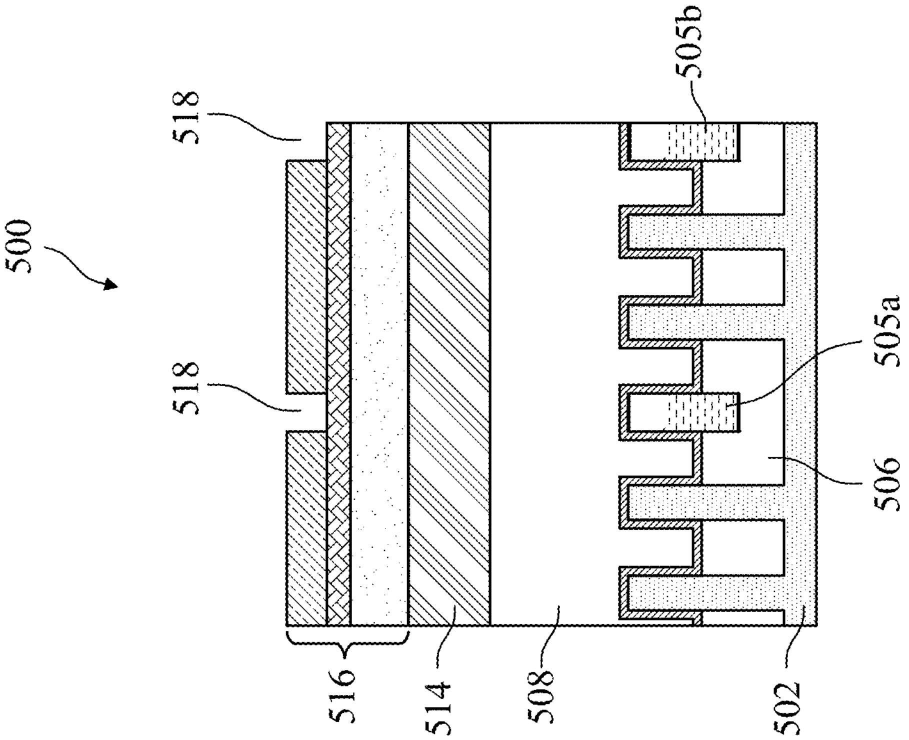
FIGS. 5C, 5F, 6C, and 6F are cross sectional views along a second cut line of the gate structure of the 3-D semiconductor device at various stages of fabrication, in accordance with some embodiments.
Figure 5B:
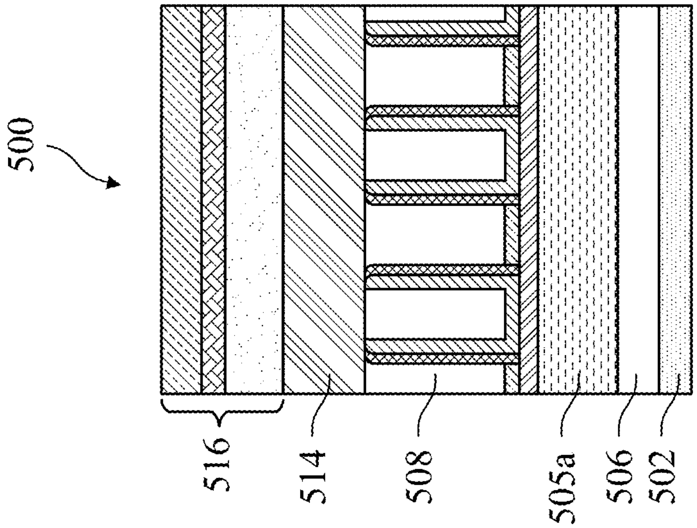
FIGS. 5B, 5E, 6B, and 6E are cross sectional views along a first cut line of the gate structure of the 3-D semiconductor device at various stages of fabrication, in accordance with some embodiments.

Referring to FIG. 4, the example process 400 includes performing lithographic operations to provide a patterned photolithographic structure above the ILD structure that exposes a region of the ILD structure to processing (operation 402). FIG. 5A provides a 3-D depiction of the example semiconductor device 500 after a patterned photolithographic structure 516 has been deposited above the ILD structure 514 and the gate structure 508. FIGS. 5B and 5C provide cross sectional views of the example semiconductor device 500 after the patterned photolithographic structure 516 has been deposited above the ILD structure 514 and the gate structure 508. As illustrated, the patterned photolithographic structure 516 includes notches 518 above the hybrid fin structures 505*a* and 505*b*. These notches expose the location of cuts to subsequently be provided in the ILD structure 514 and the gate structure 508.

Figure 5D:
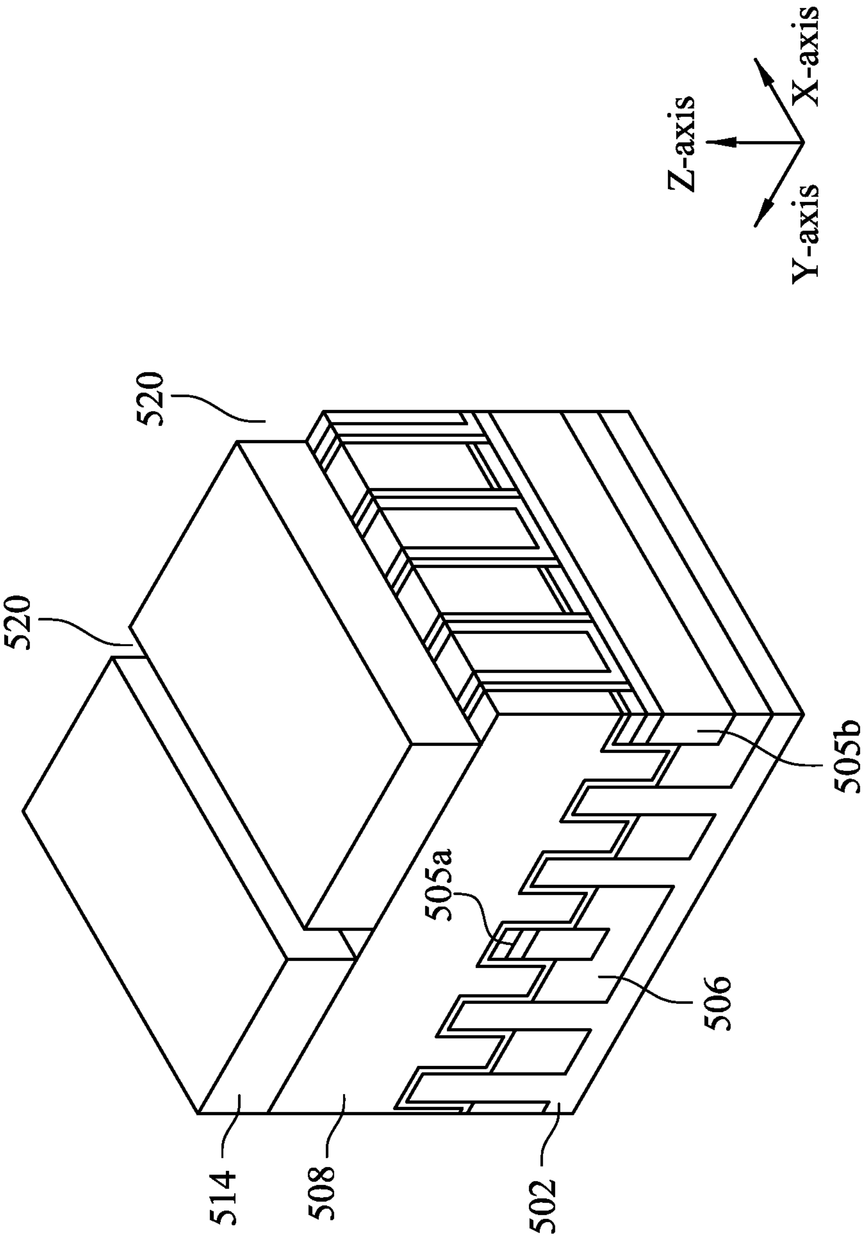
Figure 5F:
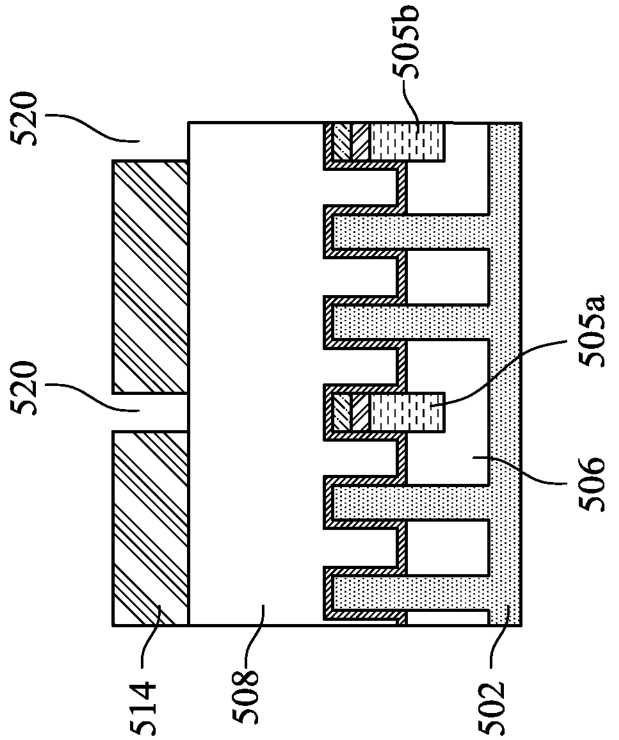
Figure 5E:
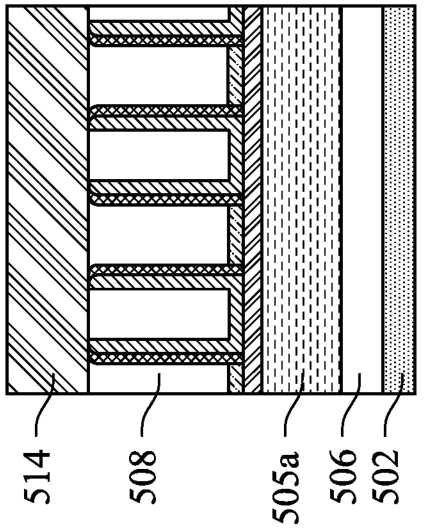

The example process 400 includes forming an opening in the ILD structure in an area exposed by the patterned lithographic structure (operation 404). FIG. 5D provides a 3-D depiction of the example semiconductor device 500 after openings 520 have been formed in the ILD structure 514. FIGS. 5E and 5F provide cross sectional views of the example semiconductor device 500 after the openings 520 have been formed in the ILD structure 514. The openings 520 may be formed by lithographic operations including patterning various layers of the photolithographic structure 516 by removing select portions thereof and forming the openings 520 through etching operations (e.g., wet or dry etching) through openings in the patterned layer of the photolithographic structure 516. The patterned layer exposes the regions of the ILD structure 514 underneath its openings to processing (e.g., etching operations) while leaving the remaining regions of the ILD structure 514 intact. After etching the opening 520 in the ILD structure 514, the photolithographic structure 516 may subsequently be removed, for example, via a wet clean or ashing process.

Figure 6A:
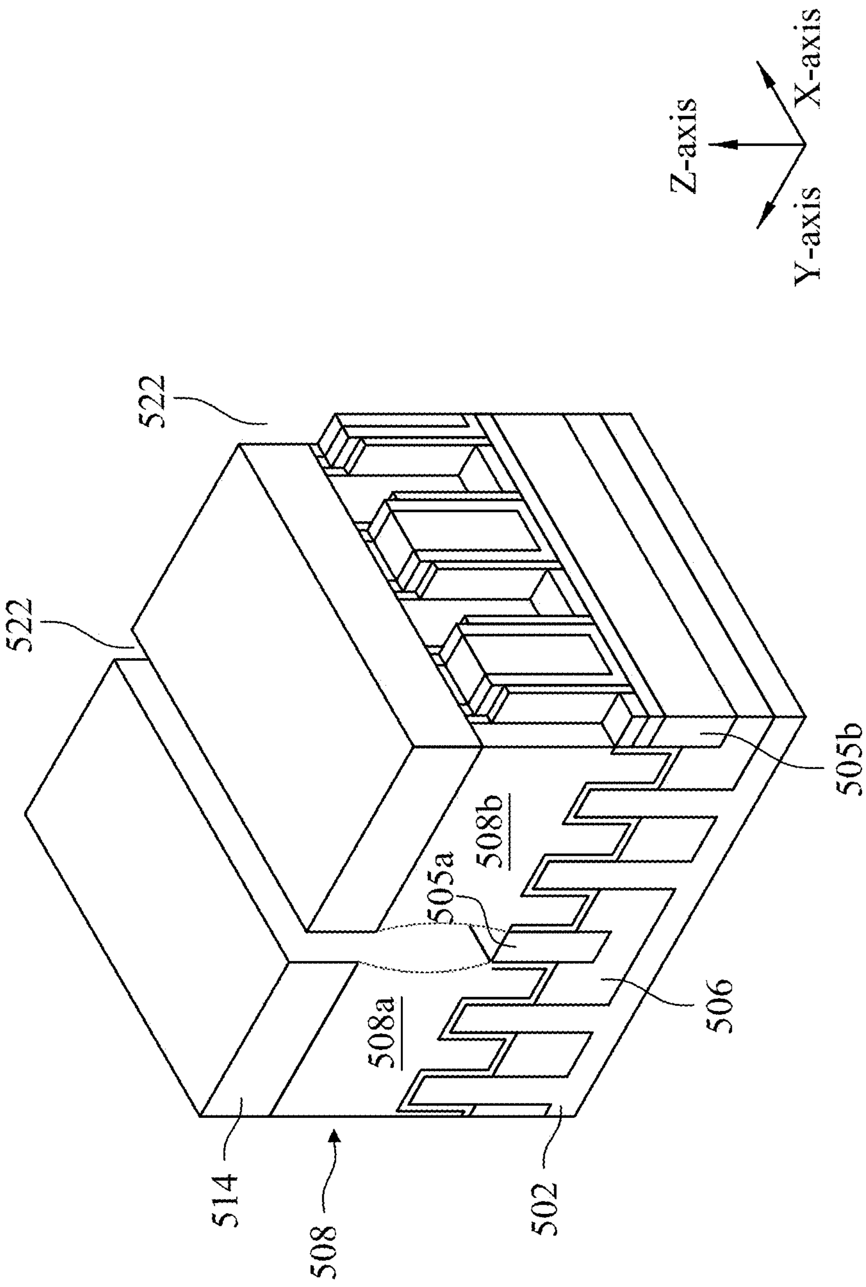
Figure 6C:
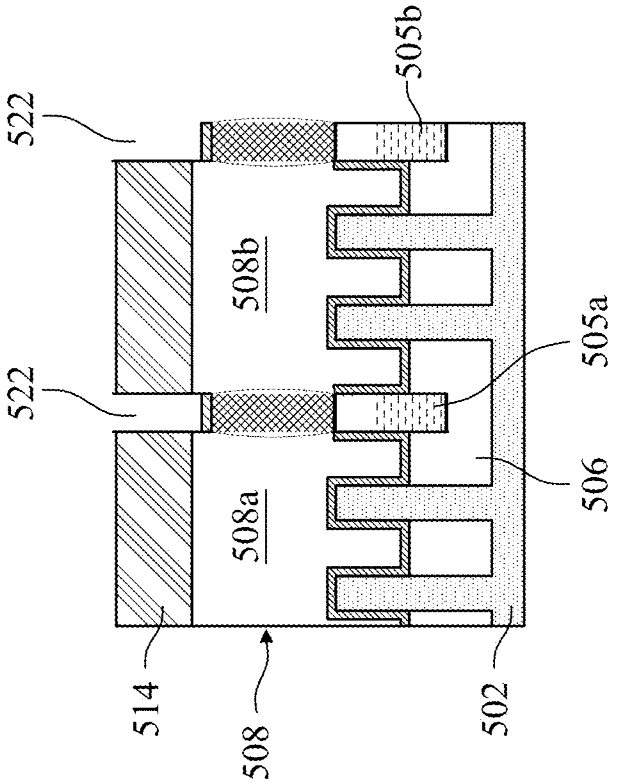
Figure 6B:
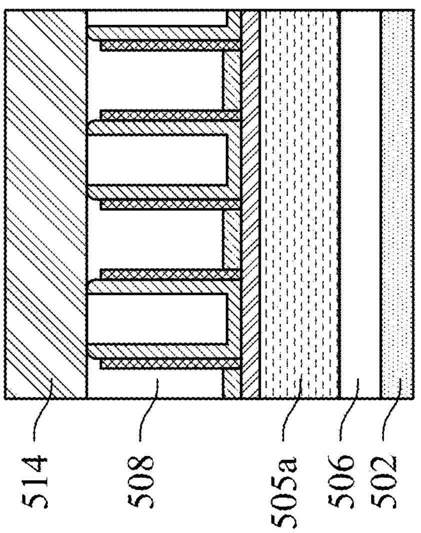

The example process 400 includes forming an opening in the gate structure to separate the gate structure into multiple gate sections (operation 406). FIG. 6A provides a 3-D depiction of the example semiconductor device 500 after openings 522 have been formed in the gate structure 508 to separate the gate structure into multiple gate sections 508*a*, 508*b*. FIGS. 5B and 5C provide cross sectional views of the example semiconductor device 500 after the openings 522 have been formed in the gate structure 508 to separate the gate structure into multiple gate sections. The openings 522 have been formed through etching operations (e.g., dry etching) that include etching condition tuning to achieve openings 522 with a BCD having a smaller dimension than a MCD (e.g., the MCD=1.2*BCD) and/or the openings 522 extending into the hybrid fin structures 505*a*, 505*b* (e.g., by at least 3 nm). The ILD structure 514 may function as a mask during the etching operations that form the openings 522 wherein the openings 520 expose the regions of the gate structure 508 underneath the openings 520 to processing (e.g., etching operations) while leaving the remaining regions of the gate structure 508 intact. In various embodiments, the opening in the gate structure is formed using operations similar to those described with respect to FIG. 2A.

Figure 6D:
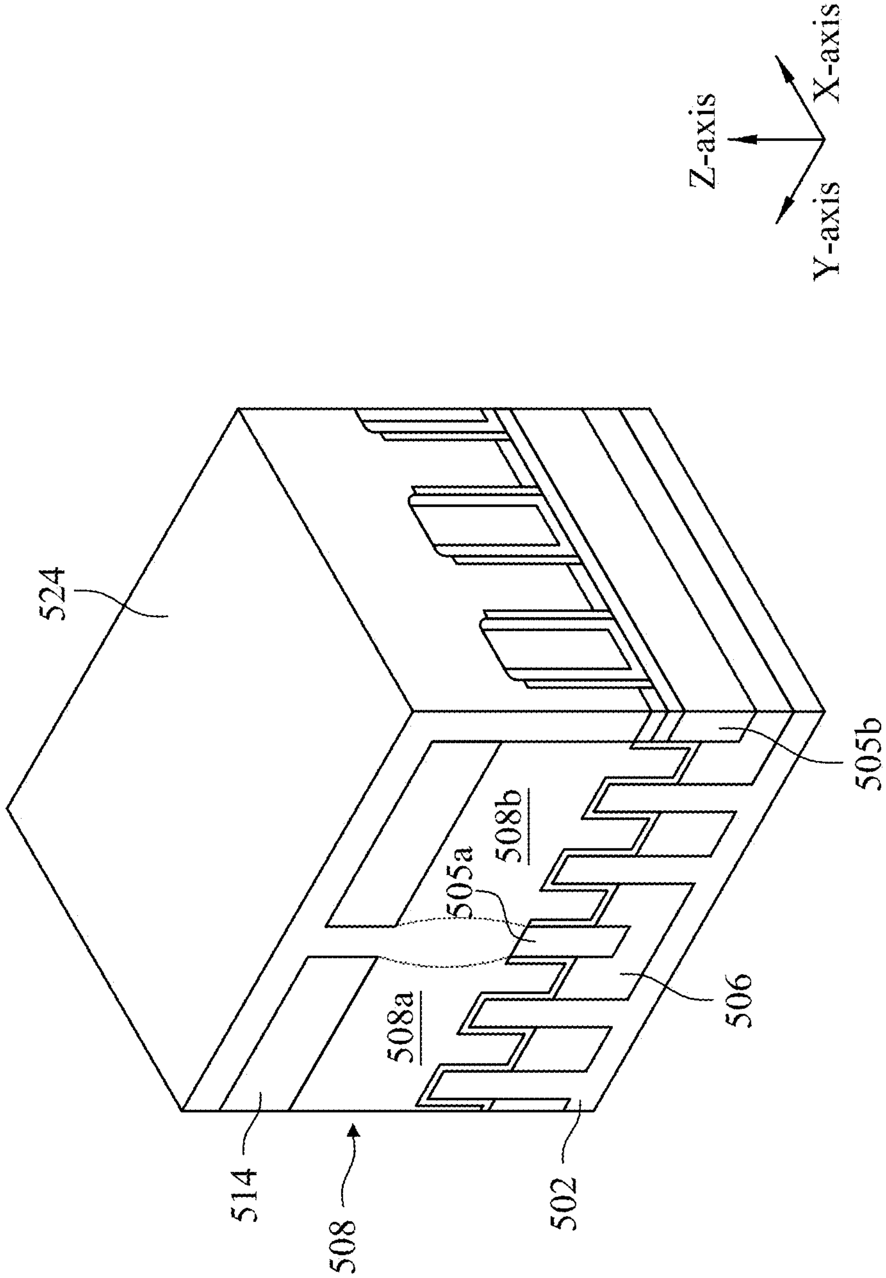
Figure 6E:
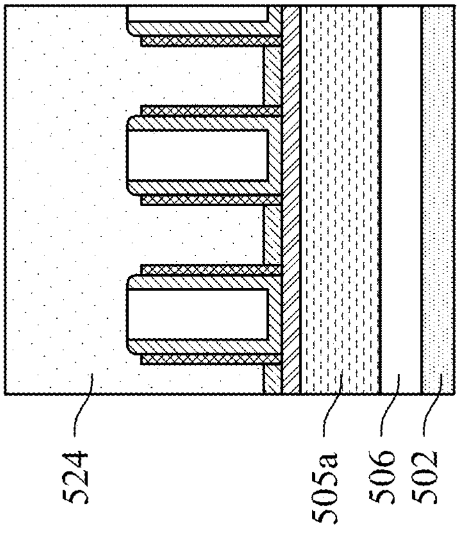
Figure 6F:
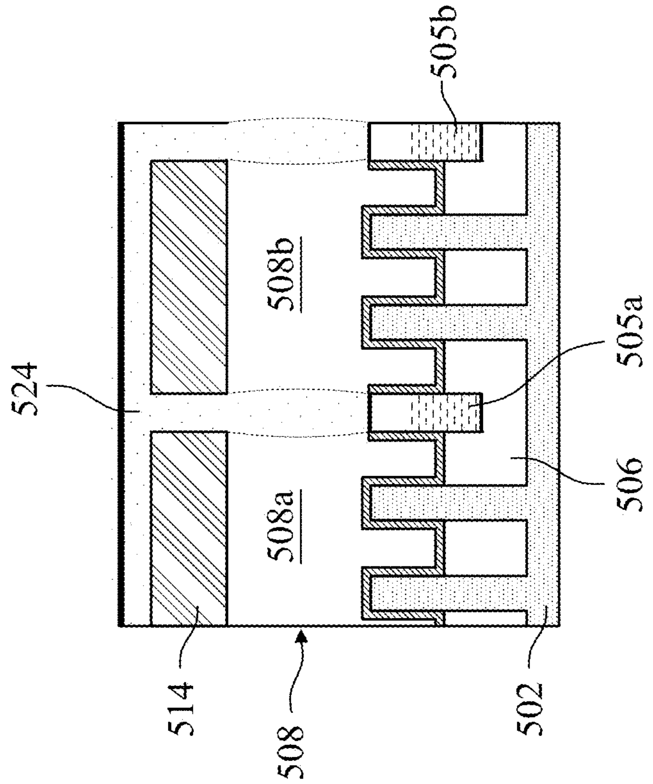

The example process 400 also includes filling the opening in the gate structure with dielectric material (operation 408). FIG. 6D provides a 3-D depiction of the example semiconductor device 500 after the openings 520, 522 have been filled with a dielectric material 524. FIGS. 6E and 6F provide cross sectional views of the example semiconductor device 500 after the openings 520, 522 have been filled with a dielectric material 524. The openings 520, 522 may be filled with the dielectric material 524 via deposition operations. The deposition operations may include chemical vapor deposition (CVD), physical vapor deposition (PVD), atomic layer deposition (ALD), or another deposition technique.

Figure 7:
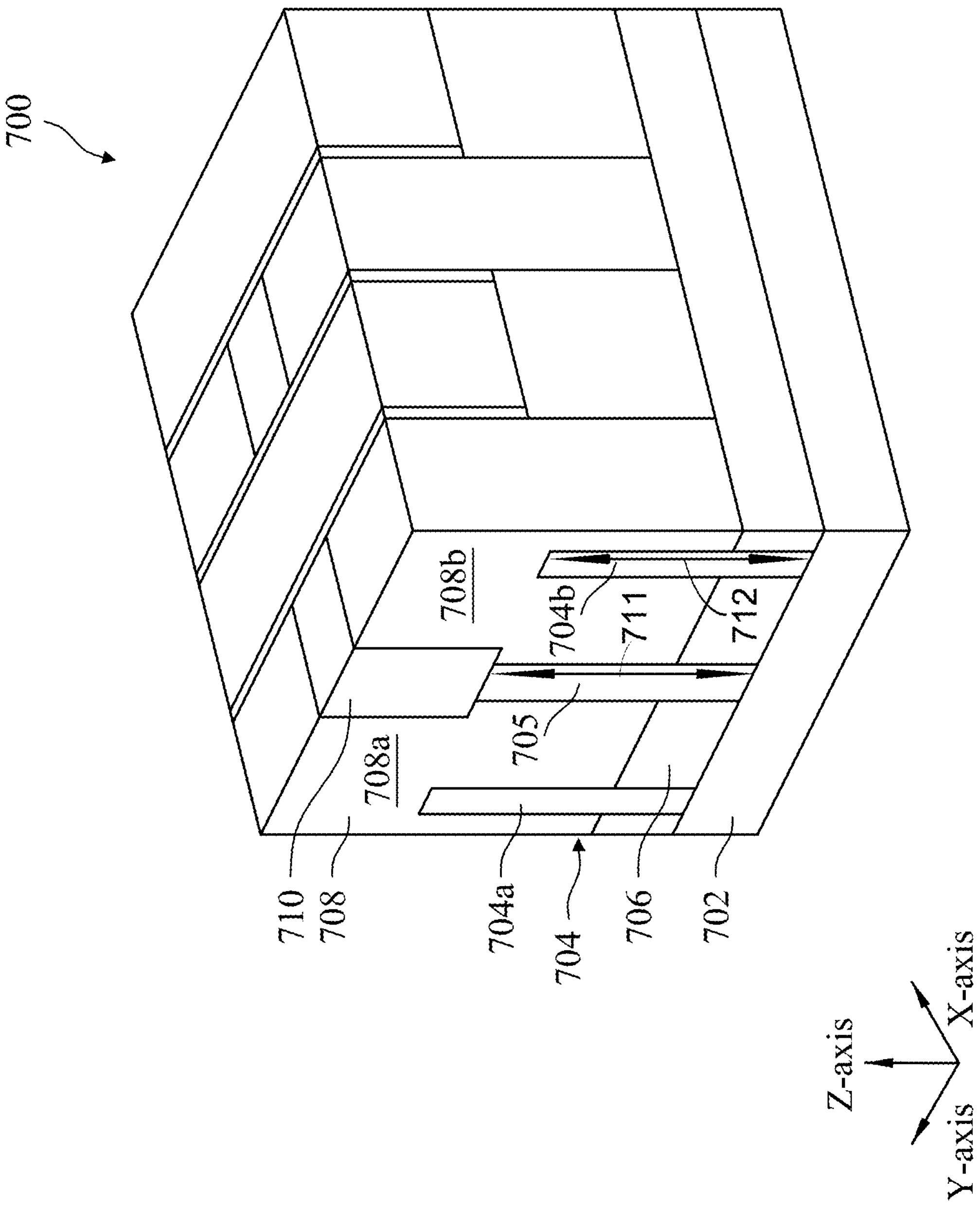
FIG. 7 is diagram depicting an isometric view of an example semiconductor device, in accordance with some embodiments.

FIG. 7 is an isometric view of an example semiconductor device 700. The example semiconductor device 700 includes a substrate 702 fin structures 704*a* and 704*b* (collectively referred to as 704) protruding in a Z-direction (e.g., vertical direction) above the substrate 702, and a hybrid fin structure 705 extending in a Z-direction above the substrate 702. As shown, the fin structures 704 and hybrid fin structure 705 are spaced apart from one another in a Y-direction and extend parallel to one another in an X-direction. As further shown, fin structures 704 and hybrid fin structure 705 are isolated by a shallow trench isolation (STI) region 706. The fin structures 704 are illustrated as protruding from the substrate 702, but in other embodiments may be separated from the substrate 702.

Disposed above the fin structures 704, hybrid fin structure 705, and the STI region 706 is a gate structure 708. The gate structure 708 includes a PO layer that forms a gate electrode. Disposed above the hybrid fin structure 705 is a dielectric structure 710 that along with the hybrid fin structure 705 separates the gate structure 708 into two separate gates 708*a* and 708*b*. The gates 708*a* and 708*b* are electrically isolated from each other by the dielectric structure 710 and the hybrid fin structure 705. The dielectric structure 710 has been formed in an opening that was provided via an etching process that included etching condition tuning to form the opening with a BCD having a smaller dimension than a MCD (e.g., the MCD=1.2*BCD) and/or the opening extending into the hybrid fin structure 705 (e.g., by at least 3 nm).

In various embodiments, the MCD of the dielectric structure 710 is approximately 1.2 times the BCD of the dielectric structure 710. In various embodiments, the dielectric structure 710 extends into the hybrid fin structure 705 at a distance in the Z-direction to a height that is below the height of the at least two of the plurality of fin structures 704*a*, 704*b*. In various embodiments, the dielectric structure 710 extends into the hybrid fin structure 705 at a distance in the Z-direction to a height 711 that is at least 3 nm below the height 712 of the fin structures 704*a*, 704*b*. In these embodiments, the height 711 of the hybrid fin structure 705 prior to the etching process that included the etching condition tuning was at least as high as the height 712 of the fin structures 704*a*, 704*b*.

The example semiconductor device 700 has reduced leakage risk between the isolated gates 708*a* and 708*b* due to the dielectric structure 710 having a BCD with a smaller dimension than a MCD (e.g., the MCD=1.2*BCD) and the dielectric structure 710 extending into the hybrid fin structure 705. The dielectric structure 710 along with the STI region 706 and the fin structure 705 work cooperatively to isolate the gates 708*a* and 708*b* from each other.

The described systems, methods, and techniques can provide semiconductor devices and methods of fabricating semiconductor devices that have a reduced leakage risk between isolated gates due to improved CPO and CMG processes. The described systems, methods, and techniques can utilize etching condition tuning to improve CPO and CMG processes. The described systems, methods, and techniques can be applied to dense cuts and isolation cuts.

A method of fabricating a semiconductor device includes: providing a substrate containing a plurality of fins and a hybrid fin that extend vertically above the substrate with a contiguous gate structure on three sides of each of the plurality of fins and the hybrid fin, and shallow trench isolation (STI) material disposed between the plurality of fins and the hybrid fin; providing a dielectric structure above and around the contiguous gate structure; providing a first opening in the dielectric structure above the hybrid fin; and etching the portion of the contiguous gate structure underneath the first opening and above the hybrid fin to form a second opening in the contiguous gate structure, the second opening having a middle critical dimension (MCD) and a bottom critical dimension (BCD), the second opening separating the gate structure into two gate sections. The etching includes: selecting a passivation gas for controlling polymer layer formation during the etching; performing partial etching operations using a gas source that includes the etch gas, the passivation gas, and a dilute gas to cut the second opening in the contiguous gate structure, wherein a polymer layer forms on sidewalls of the second opening; repeating the partial etching operations and subsequent polymer layer formation to form the second opening with the bottom of the second opening resting on the top of the hybrid fin and the MCD of the second opening being greater than the BCD of the second opening; and removing the polymer layer formed in the second opening; wherein the second opening has a bottom profile resulting from the etching that reduces a leakage risk between the gate sections.

In certain embodiments of the method, the MCD of the second opening is approximately 1.2 times the BCD of the second opening.

In certain embodiments of the method, the repeating partial etching operations includes etching away a gate dielectric layer disposed above the fin structure.

In certain embodiments of the method, the repeating partial etching operations includes etching away a portion of the height of the hybrid fin.

In certain embodiments of the method, the portion of the height of the hybrid fin that is etched away is greater than 3 nm.

In certain embodiments of the method, the etching the contiguous gate structure includes cutting two parallel contiguous gate structures during the etching and the second opening separates each of the two parallel contiguous gate structures into two separate portions.

In certain embodiments of the method, each of the two parallel contiguous gate structures 304 provide a gate for at least two parallel fins wherein the two parallel fins have a pitch between them of about 10 to 50 nm.

In certain embodiments of the method, the etching the contiguous gate structure includes cutting more than two parallel contiguous gate structures during the etching and the second opening includes a trench that separates each of the more than two parallel contiguous gate structures into two separate portions.

In certain embodiments of the method, each of the more than two parallel contiguous gate structures provides a gate for a fin having a fin pitch between a parallel fin of about 50 to 100 nm.

In certain embodiments of the method, the contiguous gate structure includes a polysilicon (PO) structure.

A semiconductor device includes: a substrate with a plurality of fin structures protruding in a Z-direction above the substrate and a non-conductive hybrid fin structure disposed between at least two of the plurality of fin structures; shallow trench isolation (STI) material disposed between and isolating the fin structures from each other; a gate structure that includes a first isolated gate and a second isolated gate; and a dielectric structure that, along with the hybrid fin structure and the STI material, isolates the first isolated gate and the second isolated gate, wherein the dielectric structure has a bottom critical dimension (BCD) that is smaller than a middle critical dimension (MCD) and the dielectric structure extends into the hybrid fin structure.

In certain embodiments of the semiconductor device, the MCD of the dielectric structure is approximately 1.2 times the BCD of the dielectric structure.

In certain embodiments of the semiconductor device, the dielectric structure extends into the hybrid fin structure at a distance in the Z-direction to a height that is below the height of the at least two of the plurality of fin structures.

In certain embodiments of the semiconductor device, the dielectric structure extends into the hybrid fin structure at a distance in the Z-direction to a height that is at least 3 nm below the height of the at least two of the plurality of fin structures.

In certain embodiments of the semiconductor device, the contiguous gate structure includes a polysilicon (PO) structure.

A method of fabricating a semiconductor device includes: providing a semiconductor device that includes a substrate, fin structures protruding in a Z-direction above the substrate, shallow trench isolation (STI) material disposed between the fin structures, a gate structure that includes a polysilicon (PO) layer disposed above the fin structures and the STI material, and an interlayer dielectric (ILD) structure disposed above and around the PO layer. The method further includes performing lithographic operations to provide a patterned photolithographic structure above the ILD structure that exposes a region of the ILD structure above a hybrid fin structure to processing; forming a first opening in the ILD structure in the exposed region; forming a second opening in the gate structure to separate the gate structure into multiple gate sections, wherein the second opening has a bottom that rests on the top of the hybrid fin structure, wherein the second opening has a bottom critical dimension (BCD) that is smaller than a middle critical dimension (MCD) of the second opening; and filling the first and second openings in the gate structure with a dielectric material; wherein the second opening has a bottom profile that reduces a leakage risk between the multiple gate sections.

In certain embodiments of the method, the MCD of the second opening is approximately 1.2 times the BCD of the second opening.

In certain embodiments of the method, the forming the second opening in the gate structure includes: selecting a passivation gas for controlling polymer layer formation during the etching; performing partial etching operations using a gas source that includes the etch gas, the passivation gas, and a dilute gas to cut the second opening in the gate structure, wherein a polymer layer forms on sidewalls of the second opening; repeating the partial etching operations and subsequent polymer layer formation to form the second opening with the bottom of the second opening resting on the top of the hybrid fin and the MCD of the second opening being greater than the BCD of the second opening; and removing the polymer layer formed in the second opening.

In certain embodiments of the method, the repeating the partial etching operations includes: etching away a gate dielectric layer disposed above the fin structure; and etching away a portion of the height of the hybrid fin.

In certain embodiments of the method, the portion of the height of the hybrid fin that is etched away is greater than 3 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a substrate containing a plurality of fins and a hybrid fin that extend vertically above the substrate a contiguous replacement gate structure on three sides of each of the plurality of fins and the hybrid fin and shallow trench isolation (STI) material disposed between the plurality of fins and the hybrid fin;

forming a dielectric structure above and around the contiguous replacement gate structure;

forming a first opening in the dielectric structure above the hybrid fin; and etching a portion of the contiguous replacement gate structure underneath the first opening and above the hybrid fin to form a second opening in the contiguous replacement gate structure with a bottom of the second opening resting on a top of the hybrid fin, the second opening having a middle critical dimension (MCD) and a bottom critical dimension (BCD) on a top of the hybrid fin, the second opening separating the contiguous replacement gate structure into a first replacement gate section and a second replacement gate section, the etching comprising:

repeatedly performing partial etching operations comprising selectively applying a passivation gas to control a rate of polymer layer formation on sidewalls of the first replacement gate section and the second replacement gate section defined by the second opening in the contiguous replacement gate structure during the etching to cut the second opening in the contiguous replacement gate structure with the bottom of the second opening resting on the top of the hybrid fin and the MCD of the second opening being greater than the BCD on the top of the hybrid fin; and removing a polymer layer formed above the hybrid fin in the second opening on the sidewalls of the first replacement gate section and the second replacement gate section defined by the second opening;

wherein the second opening between the first replacement gate section and the second replacement gate section has a bottom profile with the MCD of the second opening between the first replacement gate section and the second replacement gate section at least 1.2 times the BCD on the top of the hybrid fin.

2. The method of claim 1, wherein the repeatedly performing partial etching operations comprises etching away a gate dielectric layer disposed above the hybrid fin.

3. The method of claim 1, wherein the repeatedly performing partial etching operations comprises etching away a portion of a height of the hybrid fin.

4. The method of claim 3, wherein the portion of the height of the hybrid fin that is etched away is greater than 3 nm.

5. The method of claim 1, wherein etching the contiguous replacement gate structure comprises cutting two parallel contiguous replacement gate structures during the etching and the second opening separates each of the two parallel contiguous replacement gate structures into two separate portions.

6. The method of claim 5, wherein each of the two parallel contiguous replacement gate structures provides a gate for at least two parallel fins wherein the at least two parallel fins have a pitch between them of about 7 to 50 nm.

7. The method of claim 1, wherein etching the contiguous replacement gate structure comprises cutting more than two parallel contiguous replacement gate structures during the etching and the second opening comprises a trench that separates each of the more than two parallel contiguous replacement gate structures into two separate portions.

8. The method of claim 7, wherein each of the more than two parallel contiguous replacement gate structures provides a gate for a fin having a fin pitch between a parallel fin of about 50 to 100 nm.

9. The method of claim 1, further comprising forming a second dielectric structure between the first replacement gate section and the second replacement gate section by filling the second opening in the contiguous replacement gate structure with a dielectric material and wherein the hybrid fin is disposed between at least two fin structures of the plurality of fins, and the second dielectric structure extends into the hybrid fin at a distance in a Z-direction to a height that is below the height of the at least two fin structures.

10. The method of claim 1, further comprising forming a second dielectric structure between the first replacement gate section and the second replacement gate section by filling the second opening in the contiguous replacement gate structure with a dielectric material and wherein the hybrid fin is disposed between at least two fin structures of the plurality of fins, and the second dielectric structure extends into the hybrid fin at a distance in a Z-direction to a height that is at least 3 nm below the height of the at least two fin structures.

11. A method comprising:

forming a semiconductor device comprising: a substrate, fin structures protruding in a Z-direction above the substrate, a hybrid fin, shallow trench isolation (STI) material disposed between the fin structures, a replacement gate structure disposed above the fin structures and the STI material, and an interlayer dielectric (ILD) structure disposed above and around the replacement gate structure;

performing lithographic operations to provide a patterned photolithographic structure above the ILD structure that exposes a region of the ILD structure above the hybrid fin to processing;

forming a first opening in the ILD structure in the exposed region;

forming a second opening in the replacement gate structure to separate the replacement gate structure into a first replacement gate section and a second replacement gate section, the forming comprising selectively applying a passivation gas to control a rate of polymer layer formation on sidewalls of the first replacement gate section and the second replacement gate section defined by the second opening while forming the second opening in the replacement gate structure to cut the second opening in the replacement gate structure with the second opening having a bottom that rests on a top of the hybrid fin and a bottom critical dimension (BCD) that is smaller than a middle critical dimension (MCD) of the second opening; and forming a dielectric structure between the first replacement gate section and the second replacement gate section by filling the second opening in the replacement gate structure with a dielectric material;

wherein the second opening between the first replacement gate section and the second replacement gate section has a bottom profile with the MCD of the second opening between the first replacement gate section and the second replacement gate section at least 1.2 times the BCD of the second opening between the first replacement gate section and the second replacement gate section.

12. The method of claim 11, wherein forming the second opening in the replacement gate structure comprises:

performing partial etching operations using a gas source comprising an etch gas, the passivation gas, and a dilute gas to cut the second opening in the replacement gate structure, wherein a polymer layer forms on sidewalls of the first replacement gate section and the second replacement gate section defined by the second opening;

repeating the partial etching operations and subsequent polymer layer formation to form the second opening with the bottom of the second opening resting on the top of the hybrid fin and the MCD of the second opening being greater than the BCD of the second opening; and removing the polymer layer formed above the hybrid fin in the second opening on the first replacement gate section and the second replacement gate section.

13. The method of claim 12, wherein repeating the partial etching operations comprises:

etching away a gate dielectric layer disposed above the fin structures; and etching away a portion of a height of the hybrid fin.

14. The method of claim 13, wherein the portion of the height of the hybrid fin that is etched away is greater than 3 nm.

15. The method of claim 11, wherein the hybrid fin is disposed between at least two fin structures, and the dielectric structure extends into the hybrid fin at a distance in the Z-direction to a height that is below the height of the at least two fin structures.

16. The method of claim 11, wherein the hybrid fin is disposed between at least two fin structures, and the dielectric structure extends into the hybrid fin at a distance in the Z-direction to a height that is at least 3 nm below the height of the at least two fin structures.

17. A method comprising:

providing a semiconductor device comprising: a substrate, a plurality of fin structures protruding in a Z-direction above the substrate, a hybrid fin disposed between at least two fin structures of the plurality of fin structures and extending in a Z-direction above the substrate, a replacement gate structure disposed above the plurality of fin structures and the hybrid fin, and a dielectric layer disposed above and around the replacement gate structure;

forming a first opening in the dielectric layer above the hybrid fin;

etching a second opening in the replacement gate structure below the first opening that separates the replacement gate structure into a plurality of replacement gate sections, the etching comprising selectively applying a passivation gas to control a rate of polymer layer formation on sidewalls of the plurality of replacement gate sections defined by the second opening while etching the second opening in the replacement gate structure to cut the second opening in the replacement gate structure with the second opening having a bottom that rests on a top of the hybrid fin and a bottom critical dimension (BCD) that is smaller than a middle critical dimension (MCD) of the second opening, the etching further comprising:

performing partial etching operations using a gas source comprising an etch gas, the passivation gas, and a dilute gas to cut the second opening in the replacement gate structure, wherein a polymer layer forms on sidewalls of the plurality of replacement gate sections defined by the second opening;

repeating the partial etching operations and subsequent polymer layer formation to form the second opening with the bottom of the second opening resting on a top of the hybrid fin and the MCD of the second opening being greater than the BCD of the second opening; and removing the polymer layer formed above the hybrid fin in the second opening on the plurality of replacement gate sections;

wherein the second opening has a bottom profile resulting from the etching that reduces a leakage risk between the plurality of replacement gate sections; and forming a dielectric structure by filling the first opening and the second opening with a dielectric material, wherein the dielectric structure has an MCD and a BCD;

wherein the dielectric structure extends into the hybrid fin at a distance in the Z-direction to a height that is at least 3 nm below the height of the at least two fin structures.

18. The method of claim 17, wherein the MCD of the dielectric structure is approximately 1.2 times the BCD of the dielectric structure.

19. The method of claim 17, wherein etching the second opening in the replacement gate structure comprises cutting more than two parallel contiguous replacement gate structures during the etching and the second opening comprises a trench that separates each of the more than two parallel contiguous replacement gate structures into two separate portions.

20. The method of claim 17, wherein repeating the partial etching operations comprises etching away a portion of a height of the hybrid fin.

* * * * *